(12) United States Patent
Rogers et al.

(10) Patent No.: US 11,581,729 B2
(45) Date of Patent: Feb. 14, 2023

(54) COMBINED POSITIVE AND NEGATIVE VOLTAGE ELECTROSTATIC DISCHARGE (ESD) PROTECTION CLAMP WITH CASCODED CIRCUITRY

(71) Applicant: Cypress Semiconductor Corporation, San Jose, CA (US)

(72) Inventors: David Michael Rogers, Sunnyvale, CA (US); Henry H. Yuan, San Ramon, CA (US); Mimi Qian, Campbell, CA (US); Myeongseok Lee, Campbell, CA (US); Sungkwon Lee, Saratoga, CA (US); Yan Yi, Mountain View, CA (US); Ravindra M. Kapre, San Jose, CA (US); Murtuza Lilamwala, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 15 days.

(21) Appl. No.: 17/243,744

(22) Filed: Apr. 29, 2021

(65) Prior Publication Data
US 2021/0344193 A1 Nov. 4, 2021

Related U.S. Application Data

(60) Provisional application No. 63/018,750, filed on May 1, 2020.

(51) Int. Cl.
*H02H 9/04* (2006.01)
*H01L 27/02* (2006.01)

(52) U.S. Cl.
CPC ......... *H02H 9/046* (2013.01); *H01L 27/0266* (2013.01)

(58) Field of Classification Search
CPC ................ H02H 9/046; H01L 27/0266; H01L 27/0285
USPC .......................................................... 361/56
See application file for complete search history.

(56) References Cited

U.S. PATENT DOCUMENTS

| | | | |
|---|---|---|---|
| 3,940,683 A | 2/1976 | Blauschild | |
| 4,987,465 A | 1/1991 | Longcor et al. | |
| 5,508,649 A | 4/1996 | Shay | |
| 5,644,459 A | 7/1997 | Lien | |
| 5,780,897 A * | 7/1998 | Krakauer | H01L 27/0266 257/358 |
| 6,768,616 B2 | 7/2004 | Mergens et al. | |
| 7,035,069 B2 | 4/2006 | Takikawa et al. | |

(Continued)

OTHER PUBLICATIONS

Wikipedia, "Cascode", Aug. 1, 2019. https://en.wikipedia.org/w/index.php?title=Cascode&oldid=908833814.

*Primary Examiner* — Dharti H Patel

(57) ABSTRACT

A system and method for combining positive and negative voltage electrostatic discharge (ESD) protection into a clamp that uses cascoded circuitry, including detecting, by an electrostatic discharge protection system, a voltage pulse on an input pin of an integrated circuit (IC) controller, the IC controller coupled between a power supply node and a ground supply node; determining, by the ESD protection circuit, an ESD event on the input pin based on the voltage detected on the input pin; and/or controlling, by the ESD protection circuit during the ESD event, one or more clamps to transport the voltage pulse from the input pin of the IC controller to the power supply node.

20 Claims, 8 Drawing Sheets

(56) References Cited

U.S. PATENT DOCUMENTS

| | | | |
|---|---|---|---|
| 8,000,067 B1* | 8/2011 | Jin | H02H 9/046 |
| | | | 361/56 |
| 8,416,543 B2 | 4/2013 | Salcedo | |
| 11,056,879 B2* | 7/2021 | Stockinger | H01L 27/0266 |
| 11,315,919 B2* | 4/2022 | Stockinger | H01L 28/40 |
| 2005/0078419 A1* | 4/2005 | Stockinger | H01L 27/0292 |
| | | | 361/56 |
| 2013/0215541 A1* | 8/2013 | Karp | H03K 19/00346 |
| | | | 361/56 |
| 2020/0219867 A1* | 7/2020 | Grad | H01L 27/0255 |

* cited by examiner

COMBINED POSITIVE AND NEGATIVE VOLTAGE ELECTROSTATIC DISCHARGE (ESD) PROTECTION CLAMP WITH CASCODED CIRCUITRY

CROSS-REFERENCE TO RELATED APPLICATIONS

This application claims priority and benefit of U.S. Provisional Patent Application No. 63/018,750, filed on May 1, 2020, which is incorporated by reference herein in its entirety.

TECHNICAL FIELD

The present disclosure relates generally to electrostatic discharge (ESD) protection circuits, and more particularly, to a combined positive and negative voltage electrostatic discharge protection clamp with cascoded circuitry.

BACKGROUND

An ESD clamp is a device or circuit that connects one node to another when the voltage between the two nodes is greater than a clamping or triggering value. Clamps are used to prevent voltages between nodes from becoming large enough to damage devices that may be connected between the two nodes. When the voltage between the two nodes is smaller than the clamping or triggering voltage, the clamp acts like an open circuit.

BRIEF DESCRIPTION OF THE DRAWINGS

The present disclosure is illustrated by way of example, and not by way of limitation, in the figures of the accompanying drawings in which like reference numerals refer to similar elements and in which.

DETAILED DESCRIPTION

Figure 1:
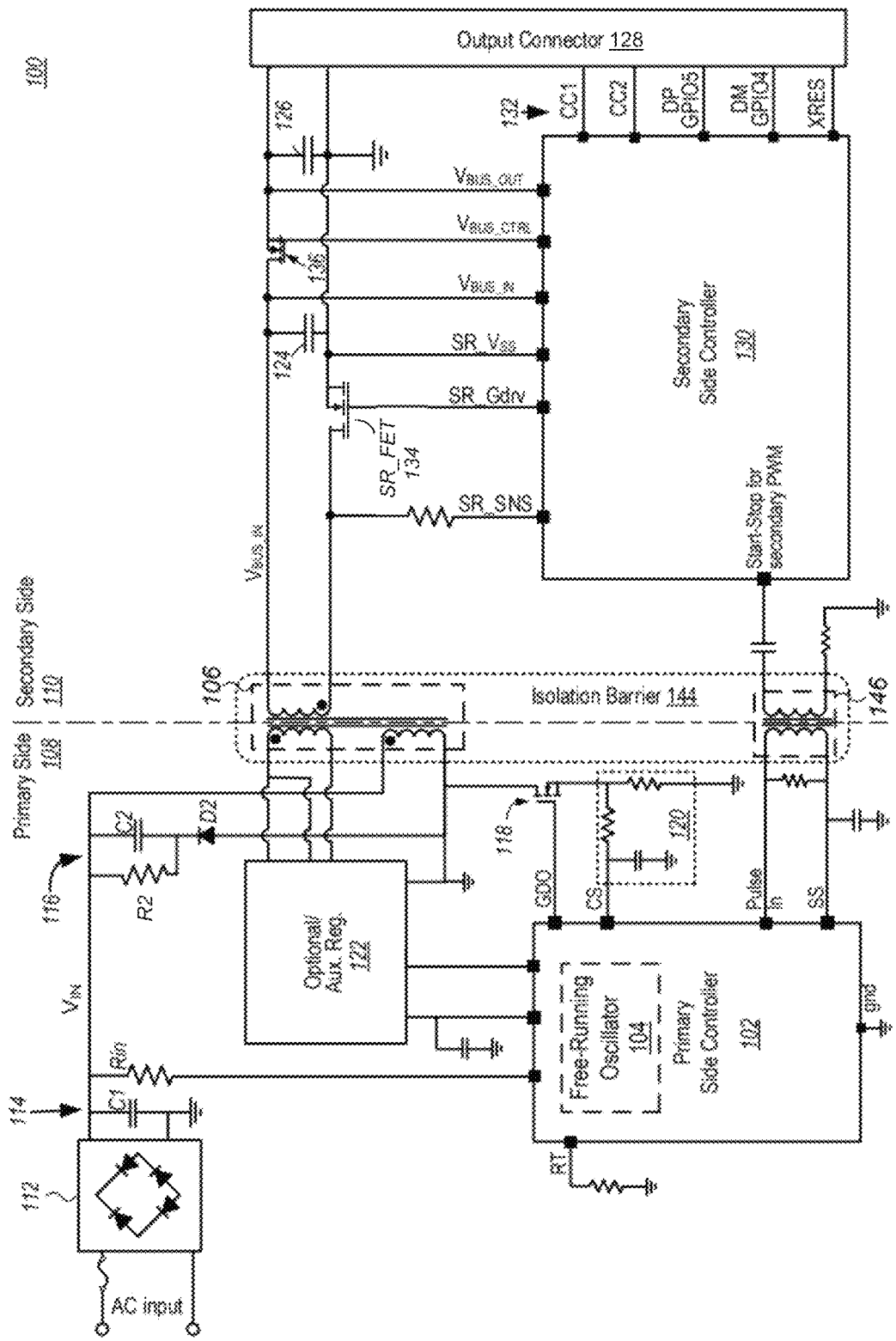
FIG. 1 is a schematic block diagram illustrating an example secondary controlled AC-DC converter that includes a primary-side controller with an independent oscillator, according to some embodiments.

The following description sets forth numerous specific details such as examples of specific systems, components, methods, and so forth, in order to provide a good understanding of various embodiments of the techniques described herein for combining positive and negative voltage electrostatic discharge protection into a clamp that uses cascoded circuitry. It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the scope of the present disclosure.

Conventional transistor technology does not make a transistor capable of protecting the pins of a chip (e.g., semiconductor, product) that can go to both negative voltages and large positive voltages in normal operation. While the pins should be protected from negative and positive going ESD pulses (both high magnitude pulses), the ESD protection circuitry should not interfere with the pin going to negative voltages during normal operation.

Although protecting against pulses that go higher in voltage than the chip's main positive power supply may be accomplished with diodes from pin to the positive power supply, protecting against pulses that go beyond the normal operating range in the negative voltage direction is a significant challenge using the conventional transistor technology. For example, one or more (or all) portions of the ESD protection circuit and/or clamp should maintain a high impedance during normal operation while the pin is intentionally pulsed to voltages that go as much as 5 volts below the voltage of the substrate. In addition, the ESD protection should maintain a high impedance during normal operation while the pin is intentionally pulsed to voltages that go as much as 8 volts above the voltage of the substrate.

During ESD events, the protection clamp should also turn on and quickly draw current. The clamp should turn on abruptly, going from high impedance in the −5V to +8V range to very low impedances for voltages just outside of that voltage range. The characteristics of the clamp should remain stable over variations in process and variations in temperature. The clamp should turn on abruptly, going from high impedance in the −5V to +8V range to very low impedances for voltages just outside of that voltage range even at the extremes of temperature and extremes in process variation. The clamp should not leak more than roughly 10 uA at the voltage extremes of normal operation (−5 to +8 volts). The fabricated circuit should adequately protect the pin against 2,000 Volt Human Body Model (HBM), which is an ESD test that applies a large voltage between two nodes of a chip. The fabricated circuit should adequately protect the pin against 500 Volt charged device model testing (CDM), which is an ESD test that applies a large electric field between two nodes of a chip that induces a large voltage between the nodes. The circuit should adequately tolerate standard latch-up test stressing.

However, to meet the normal operation negative voltage device isolation requirements (e.g., isolating the clamp's negative voltage nodes from the grounded substrate) and to also be able to clamp during negative ESD events, the transistors of the clamp should be electrically isolated from the chip's substrate in at least some portions of the chip's normal operating range. Yet, this is not always possible when using the individual isolated transistors of a conventional transistor technology. This is because the technology's individual isolated transistors often do not have high enough breakdown voltages (e.g., voltages from drain to source) to support normal operation across the full negative and positive normal operation voltage range, and also across the larger range of positive and negative voltages required for functioning in a protection capacity during ESD events. In short, when controlling and directing the large currents associated with ESD events, the devices used for doing that controlling must not break down in any part of the larger range of voltages that is encountered during the ESD events. Some technologies, however, do not provide individual devices, that are both isolated from the substrate, and which have breakdown voltages which are large enough to allow the devices to be used in ESD protection capacities (e.g., for controlling and directing currents, etc.).

Accordingly, the present disclosure is directed to systems and methods for combining positive and negative voltage electrostatic discharge protection into an ESD protection clamp that uses cascoded circuitry to protect the one or more pins of a chip. That is, the ESD protection clamp protects one or more pins of a chip from positive and negative voltage ESD events by clamping to the product's positive power supply rather than to the product's ground supply.

In various embodiments, as described in the below passages, an ESD protection clamp of the present disclosure may include the features of: (1) clamping both the pin's positive voltage ESD protection and the pin's negative voltage ESD protection to the chip's positive power supply; (2) cascoding clamp triggering and control transistors using N-channel transistors (sometimes referred to as, "low voltage N-channel transistors") that are isolated from the substrate; (3) one or more clamp-trigger bias strings that are compensated for changes in temperature and/or semiconductor process; (4) circuitry that detects and/or reacts to negative voltage pulses on one or more pins of a chip; (5) circuitry that determines if the negative voltage pulses are due to normal operation or are due to an ESD event; (6) circuitry to accelerate the switching of P-channel transistors in the clamp control circuit stages; (7) triggering the pin's secondary ESD protection using the circuitry that triggers the pin's primary ESD protection; and/or (8) one or more capacitors that stabilizes operation of the circuit.

1. Overview of an Example ESD-Prone Circuit

FIG. 1 is a schematic block diagram illustrating an example secondary controlled AC-DC converter (sometimes referred to as, "a power converter") that includes a primary-side controller with an independent oscillator, according to some embodiments. The AC-DC converter 100 generally includes a flyback transformer 106 having a primary winding (NP) on a primary-side 108 electrically connected or coupled to an AC input, and a secondary winding (NS) on a secondary-side 110 coupled to a DC output. In some embodiments, the AC-DC converter 100 may be susceptible to an electrostatic discharge, such that the electrostatic discharge may damage one or more elements and/or components of the AC-DC converter 100. Additionally, any of the elements and/or components may be individually susceptible to an electrostatic discharge event prior to the joining of the elements and/or components into the AC-DC converter.

On the primary-side 108 a rectifying circuit, such as a bridge rectifier 112, and one or more input filters, coupled to a primary winding of the transformer 106 rectify and filter the AC input voltage to supply input power to the primary winding of the transformer. The input filters can include a first input filter 114 having a capacitor (C1) coupled to or across an output of the rectifier 112, and a second, RC filter or snubber 116 including a resistor or resistive element (R2) and a capacitor (C2) coupled in parallel between a first terminal of the primary winding of the transformer 106 and a cathode of a diode or rectifier (D2) having an anode coupled to a second terminal primary winding of the transformer. The AC-DC converter 100 further includes a power switch (PS 118), such as a primary field effect transistor (PR_FET), having a first or drain node coupled to the second terminal of the primary winding of the transformer 106, a second or gate node coupled to a gate-drive output (GDO) pin in the PSC 102, and a third or source node coupled to a current sensing (CS) pin in the PSC and, through a resistive current sensing (RCS) circuit 120 to ground to sense a primary-side current (I_primary) flowing through the primary winding when the PS 118 is closed or conducting.

Generally, the PSC 102 is further coupled to the output of the bridge rectifier 112 through a resistive element (Rin) to provide power to the PSC during a startup phase. Once the startup phase is complete and the line voltage ($V_{IN}$) is within normal operating range, and the PS 118 operates to enable power to be transferred through the flyback transformer 106, an optional/auxiliary regulator 122 coupled to an auxiliary winding of the flyback transformer 106, is used to supply power to the PSC 102. In some embodiments, the primary side controller 102 may be an integrated circuit (IC) controller.

On the secondary-side 110 the AC-DC converter 100 includes a filter capacitor 124 and an output capacitor 126 coupled between a first terminal of a secondary winding of the transformer 106 and an electrical ground to provide a DC output voltage to an output interface or connector 128. Generally, as in the embodiment shown the output connector 128 is further coupled to a secondary-side controller (SSC) 130 through a number of communication channels 132 to support various charging protocols. Suitable output connectors 128 can include those compatible with and supporting standard and proprietary charging protocols including Universal Serial Bus Power Delivery USB PD2.0 and USB PD3 with Programmable Power Supply (PPS), Qualcomm® Quick Charge, Samsung® AFC, and Apple® charging protocols. For example, the connector 128 can include a Universal Serial Bus type C (USB-C) compatible connector where the AC-DC converter 100 is compliant with the USB protocol to provide a DC output voltage of about 3.3 VDC to about 21.5 VDC at a current of from about 0 to about 5000 milliamps (mA).

The AC-DC converter 100 further includes on the secondary-side 110 a synchronous rectifier (SR 134), such as a synchronous rectifier field effect transistor (SR_FET), coupled between the second terminal of the secondary winding of the transformer 106 and the ground terminal of the DC output. The SR 134 includes a first or drain node coupled to the transformer 106 and an SR_SNS pin in the SSC 130 to sense a voltage on the drain of the SR; a second or gate node coupled to an SR gate-drive pin to drive or control the SR; and a third or source node coupled to the SR_VSS and the ground terminal of the DC output.

Optionally, as in the embodiment shown, the secondary-side 110 further includes an additional or secondary switch (SS) 136, such as an N-channel metal-oxide semiconductor field effect transistor (NFET), coupled between the transformer 106 and the DC output to enable to the SSC 130 to turn off the DC output to protect against over voltage and/or under voltage conditions. The SS 136 includes a drain node coupled to a voltage bus in pin ($V_{BUS\_IN}$) of the SSC; a gate node coupled to a voltage bus control pin ($V_{BUS\_CTRL}$) to drive or control the SS; and a source node coupled to a voltage bus out pin ($V_{BUS\_OUT}$) and to the DC output.

As shown in FIG. 1, the AC-DC converter 100 further includes an isolation circuit or barrier 144 to electrically isolate the secondary-side 110 from the high AC input voltage present on the primary-side 108. Because the transformer 106 is a step down transformer it is generally considered part of the isolation barrier 144. Additionally, where as in the embodiment shown, the AC-DC converter 100 is a flyback converter in which the SSC 130 provides feedback or pulse width modulation (PWM) signal to the PSC 102 from a PWM pin in the SSC, the isolation barrier 144 further includes a pulse edge transformer (PET 146) to couple the PWM signal to a pulse in pin in the PSC.

Figure 2:
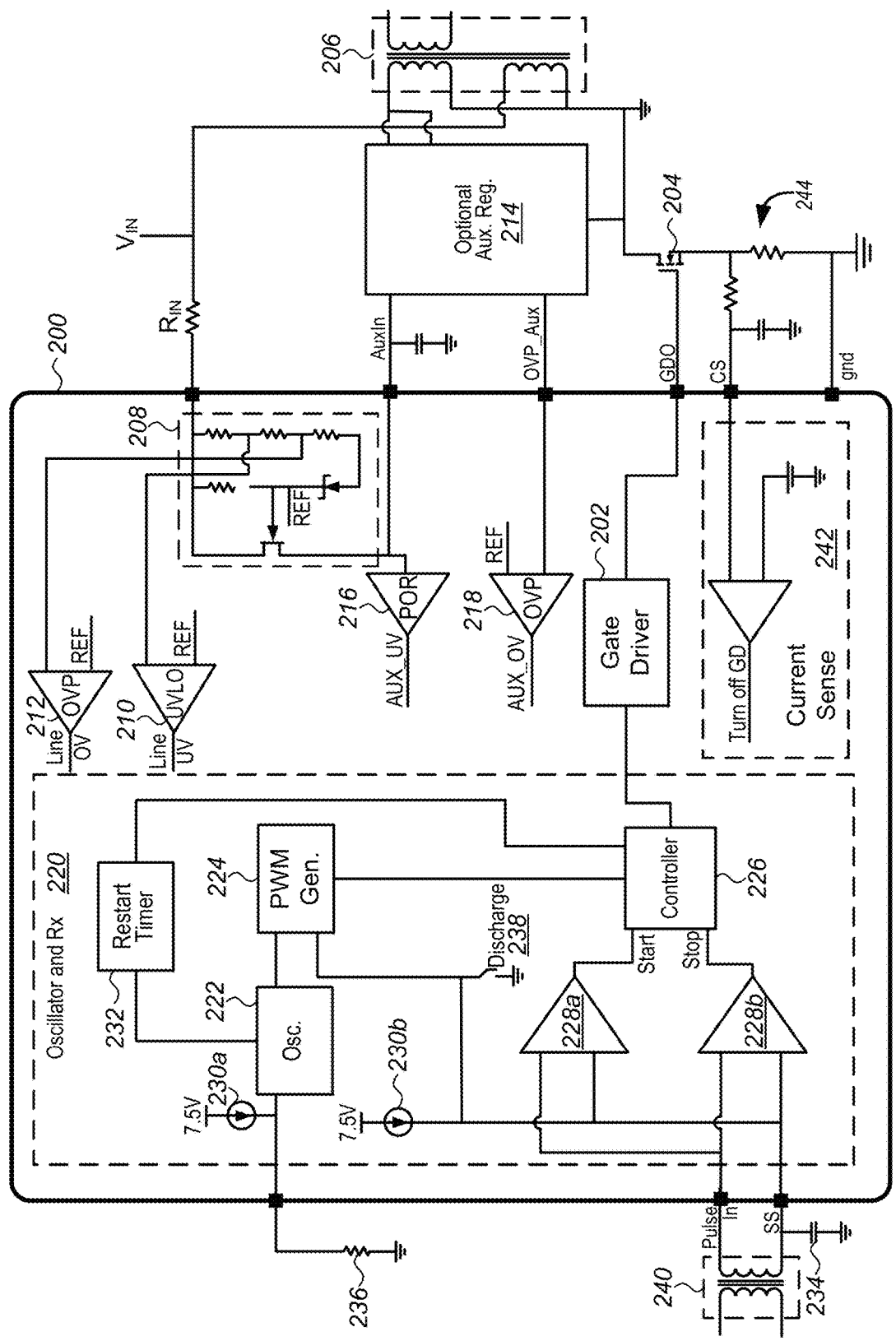
FIG. 2 is a schematic block diagram depicting an example embodiment of the primary controller of FIG. 1, according to some embodiments.

FIG. 2 is a schematic block diagram depicting an example embodiment of the primary controller of FIG. 1, according to some embodiments. The PSC 200 includes a gate driver 202 to drive an external primary FET or power switch (PS 204) through a gate-drive output (GDO) to control current flow through the primary-side of a flyback transformer 206.

A $V_{DD}$ pin of PSC 200 is connected to line voltage ($V_{IN}$) either through the bridge rectifier, as shown in FIG. 1, or directly coupled to the AC input using a high-voltage (HV) startup circuit 208. Either implementation will provide power to the PSC 200 during a startup phase. A UVLO block 210 prevents false startup when the $V_{IN}$ is low and keeps the PS 204 OFF. An OVP block 212 shuts the PS 204 OFF when line voltage exceeds a predetermined voltage. Once the line voltage is within normal operating range, the gate driver 202 starts switching the PS 204. An optional/auxiliary regulator 214 coupled to an auxiliary winding of the flyback transformer 206 is used to supply power to the PSC 200 after the startup phase. No current is sourced from the $V_{DD}$ pin after the startup phase. The voltage on the auxiliary winding is a scaled voltage of the secondary-side voltage. An auxiliary power on reset (POR) block 216 keeps the PS 204 OFF when the power or voltage supplied by the optional/auxiliary regulator 214 is low, and an auxiliary OVP block 218 shuts the PS 204 OFF when the voltage exceeds a predetermined voltage.

The PSC 200 further includes an Oscillator and Receiver (Rx) sub-circuit or block 220 to generate and provide free-running PWM signals to the gate driver 202 to turn on the PS 204 at soft-start when an SSC (not shown in this figure) is not active, and to receive PWM signals from the secondary-side once the SSC becomes active, and couple these signals to the gate driver, while decoupling the free-running PWM signals from the gate-driver.

The Oscillator and Rx block 220 includes an independent oscillator 222 to provide an oscillator signal to a pulse width modulation (PWM) generator 224 to generate and provide free-running PWM signals to the gate driver 202, a controller 226 to select which PWM signals are coupled to the gate driver, and first and second comparators 228a, 228b, through which positive and negative edges of PWM signals from the secondary-side are passed to the controller. The Oscillator and Rx block 220 further includes a number of internal voltage sources (shown in FIG. 2 as exemplary 7.5V sources) and first and second current supplies 230a, 230b to provide reference voltages to the oscillator 222 and the comparators 228a, 228b, and an auto-restart timer 232 coupled to and synchronized with or receiving from the oscillator and coupled to the controller 226 to set a predetermined or predefined time for which the PSC 200 operates in open-loop mode before checking for PWM signals from the SSC, and switching to a closed-loop mode of operation.

The Oscillator and Rx block 220 supports a soft-start operation by gradually increasing a duty cycle from DCmin to DCmax using an external capacitor 234 connected to an SS pin of the PSC 200 and charged by the internal current source 230b. The duration for the soft-start operation is set by the external capacitor 234 and will depend on a current from the internal current source 230b. A suitable current can include, for example, a current of about 5 µA. Similarly, a maximum amplitude for the soft-start ramp-up is limited to about half the voltage of the internal voltage sources, or about 3.75V, for the embodiment shown in FIG. 2. The oscillator 222 has a frequency (Fosc) that is set by an external resistor 236 connected to a resistor timing (RT) pin of the PSC. Generally, as in the embodiment shown, the Oscillator and Rx block 220 includes a discharge path and switch 238 to discharge the external capacitor 234 prior to or following a soft-start operation.

In addition, to generate and couple free-running PWM signals to the gate driver 202 during soft-start, the Oscillator and Rx block 220 receives pulses or PWM signals from the secondary-side controller (SSC) through a PULSE_IN pin when the secondary-side is active. The PWM signals from the secondary-side are coupled to the primary-side using a pulse edge transformer (PET 240). The PET 240 ensures proper frequency response and is selected to have an adequate Q-factor to avoid excessive overshoot. The first comparator 228a detects a positive edge of a pulse from the secondary-side indicating a start of a pulse of the PWM signal, while the second comparator 228b detects a negative edge of a pulse from the secondary-side indicating a stop or end of the pulse of PWM signal. In response to these start and stop signals received from the first and second comparators 228a, 228b, the controller 226 couples the PWM signal from the secondary-side to the gate driver 202, while simultaneously or concurrently decoupling the free-running PWM signals from the gate driver, thereby placing the AC-DC converter in a closed-loop mode of operation.

In some embodiments, such as that shown, the PSC 200 can further include a current sense block 242 to detect an over-current condition due to large current flowing from the flyback transformer 206. The current sense block 242 provides pulse-by-pulse protection when the voltage on a current sense (CS) pin exceeds a voltage threshold (Vcsm). The voltage is sensed using an external resistive current sensing (RCS) circuit 244 coupled to a primary-side of flyback transformer 206. The current sense block indirectly limits the current on the primary-side by prompting the turning OFF of the PS 204. In open-loop mode, if the voltage CS pin exceeds $V_{CSTH}$, the PSC 200 can restart in soft-start mode after the auto-restart timer 232 has timed out. In closed-loop mode, PS 204 turns ON again when the next pulse is received from the secondary-side.

2. ESD Protection Clamp for Positive and/or Negative Voltages

Figure 3:
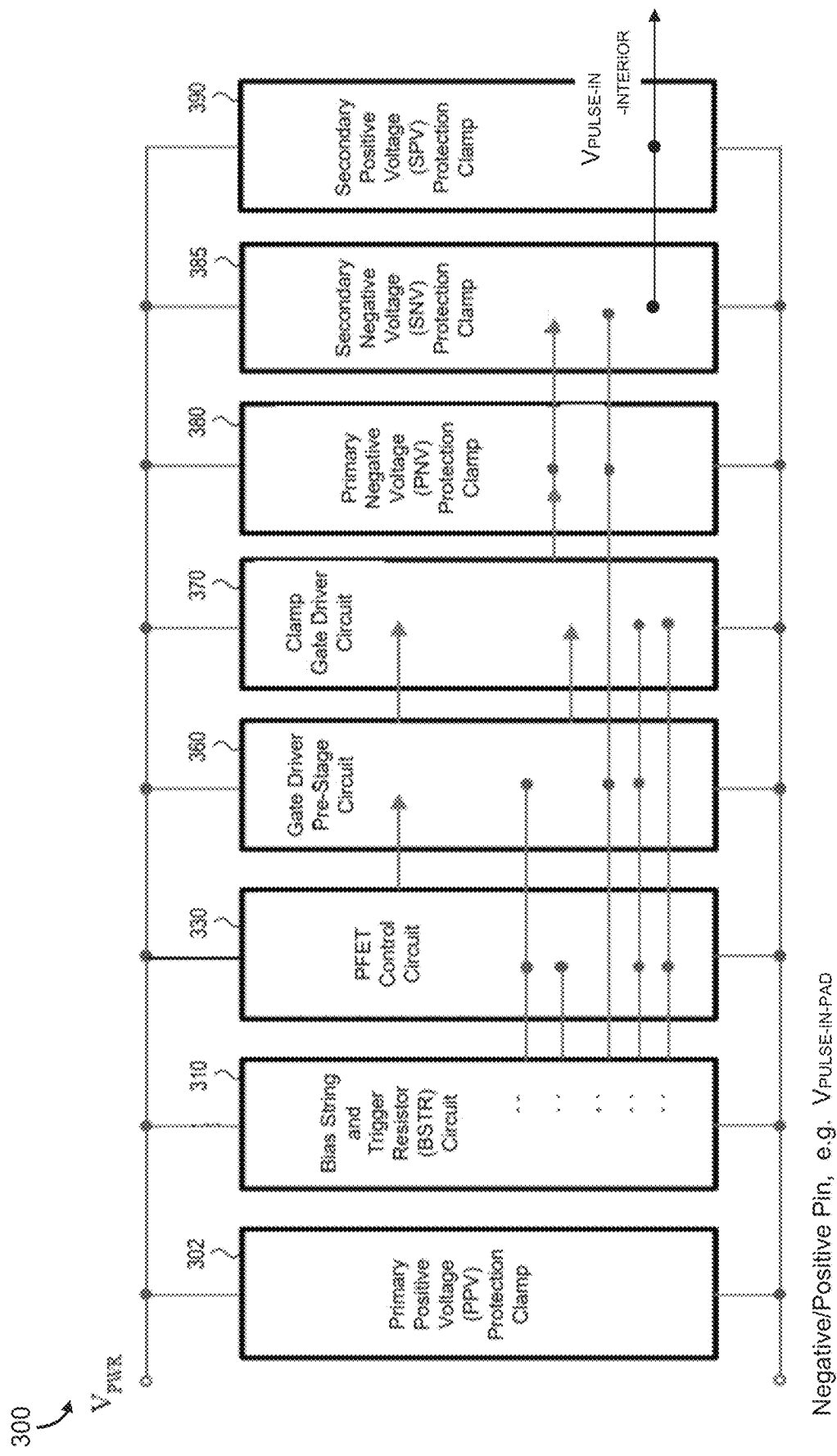
FIG. 3 is a schematic block diagram illustrating an example ESD protection clamp for simultaneously protecting a chip during an electrostatic discharge event caused by a positive voltage electrostatic discharge and/or a negative voltage electrostatic discharge, according to some embodiments.

FIG. 3 is a schematic block diagram illustrating an example ESD protection clamp for simultaneously protecting a chip during an electrostatic discharge event caused by a positive voltage (PV) electrostatic discharge and/or a negative voltage (NV) electrostatic discharge, according to some embodiments. The ESD protection clamp 300 may include a primary positive voltage (PPV) protection clamp 302 and/or a secondary positive voltage (SPV) protection clamp 390 for protecting a chip during a positive voltage (PV) ESD event. The ESD protection clamp 300 may include a bias string (sometimes referred to as, "diode-connected NFETs") and trigger resistor (BSTR) circuit 310 for generating one or more bias voltages. The ESD protection clamp 300 may include an NFET control circuit 340 (not shown in FIG. 3) for detecting a pulse based on the one or more bias voltages. The ESD protection clamp 300 may include one or more cascoded amplification stages, such as a P-channel metal-oxide semiconductor field effect transistor (PFET) control circuit 330 (e.g. FIG. 4 transistors 437 and 438), a gate driver pre-stage circuit 360, and/or a clamp gate driver circuit 370 (e.g. FIG. 4 transistor 471 with transistor 472, and transistor 473 with transistor 474). The ESD protection clamp 300 may include a primary negative voltage (PNV) protection clamp 380 and/or a secondary negative voltage (SNV) protection clamp 385 for protecting the chip during a negative voltage (NV) ESD event.

In some embodiments, the secondary positive voltage (SPV) protection and the secondary negative voltage (SNV) protection are combined with a series limiting resistor or other limiting device (e.g. resistor 426 in FIG. 4) to provide a safe path for a signal to proceed from the VPULSE-IN-PAD node to the interior of the chip. Such a signal, VPULSE-IN-INTERIOR, is shown emanating from SNV, 385, and from SPV, 390, in FIG. 3.

During normal operation, the $V_{PULSE-IN-INTERIOR}$ signal carries nearly the same information as does the negative/positive pin (e.g., $V_{Pulse-In}$ In PAG1P and $V_{PULSE-IN-PAD}$). However, in a positive voltage ESD event, the large positive ESD event voltages that appear on the $V_{PULSE-IN-PAD}$ signal line are inhibited from entering the chip through the $V_{PULSE-IN-INTERIOR}$ signal line. The $V_{PULSE-IN-INTERIOR}$ signal acts as a filtered and voltage-limited (protected) version of the $V_{PULSE-IN-PAD}$ signal.

The PPV protection clamp 302, the BSTR circuit 310, the NFET control circuit 340, the PFET control circuit 330, the gate driver pre-stage circuit 360, the clamp gate driver circuit 370, the PNV protection clamp 380, and/or the SPV protection clamp 390 may each be coupled between a chip's power (shown in FIG. 3 as, "$V_{PWR}$") and a negative/positive pin (shown in FIG. 3 as, "$V_{PULSE-IN-PAD}$") of the chip.

The ESD protection clamp 300 may be configured to protect a pin (or a plurality of pins) of a chip that may swing (e.g., toggle, fluctuate, transition) to positive and/or negative voltages in normal operation of the chip. That is, the ESD protection clamp 300 may be configured to protect a pin (or a plurality of pins) of a chip from an NV-ESD event, wherein the pin's normal operation lowest voltage level is negative relative to the lowest most voltage power supply on the chip. In some embodiments, the lowest most voltage power supply could be the chip's ground power supply or ground pin. In some embodiments, the protected pin's voltage may be less than the voltage of any power supply voltage that is generated on the chip (e.g., a supply that is charge pumped to negative voltage values relative to ground). In some embodiments, the ESD protection clamp 300 may be configured to protect one or more pins (e.g., Pulse In, SS, CS, etc.) of the primary side controller 102 in FIG. 1.

The ESD protection clamp 300 may be configured to protect a pin (or a plurality of pins) of a chip from a PV-ESD event, wherein the pin's normal operation highest voltage level may be as high in voltage as the highest voltage power supply on the chip. During a positive voltage ESD event (e.g., pulses, etc.) on the protected pin, the ESD protection clamp circuit 300 may clamp a pin to the positive power supply node via one or more forward biased diodes. In some embodiments, the ESD protection clamp 300 may clamp the chip's positive power supply node to one of the chip's ground supply nodes via a common power supply clamp.

In some embodiments, the ESD protection clamp 300 may clamp a pin to only the chip's positive voltage power supply, which causes a vast majority of clamping current to run into or out of the chip's positive voltage power supply. In some embodiments, the ground supply may be only minimally connected to the clamp (e.g., via the chip substrate, through substrate connections, etc.). In contrast, conventional ESD protection circuits will clamp to both the ground supply and to the positive voltage supply, which causes a large proportion of the ESD event current to run into or out of the ground supply during at least some polarities of ESD stressing.

In some embodiments, the ESD protection clamp 300 may be configured as a combined positive and negative voltage ESD protection clamp with extended voltage range (e.g., beyond the breakdown voltage of a single transistor) using temperature and process variation compensated cascoded control circuitry.

By protecting the pin of a chip during an NV-ESD event and/or a PV-ESD event, the ESD protection clamp 300 is able to prevent (or mitigate) the NV-ESD event and/or PV-ESD event from damaging one or more circuits of the chip that are associated with and/or coupled to the protected pin.

Figure 4:
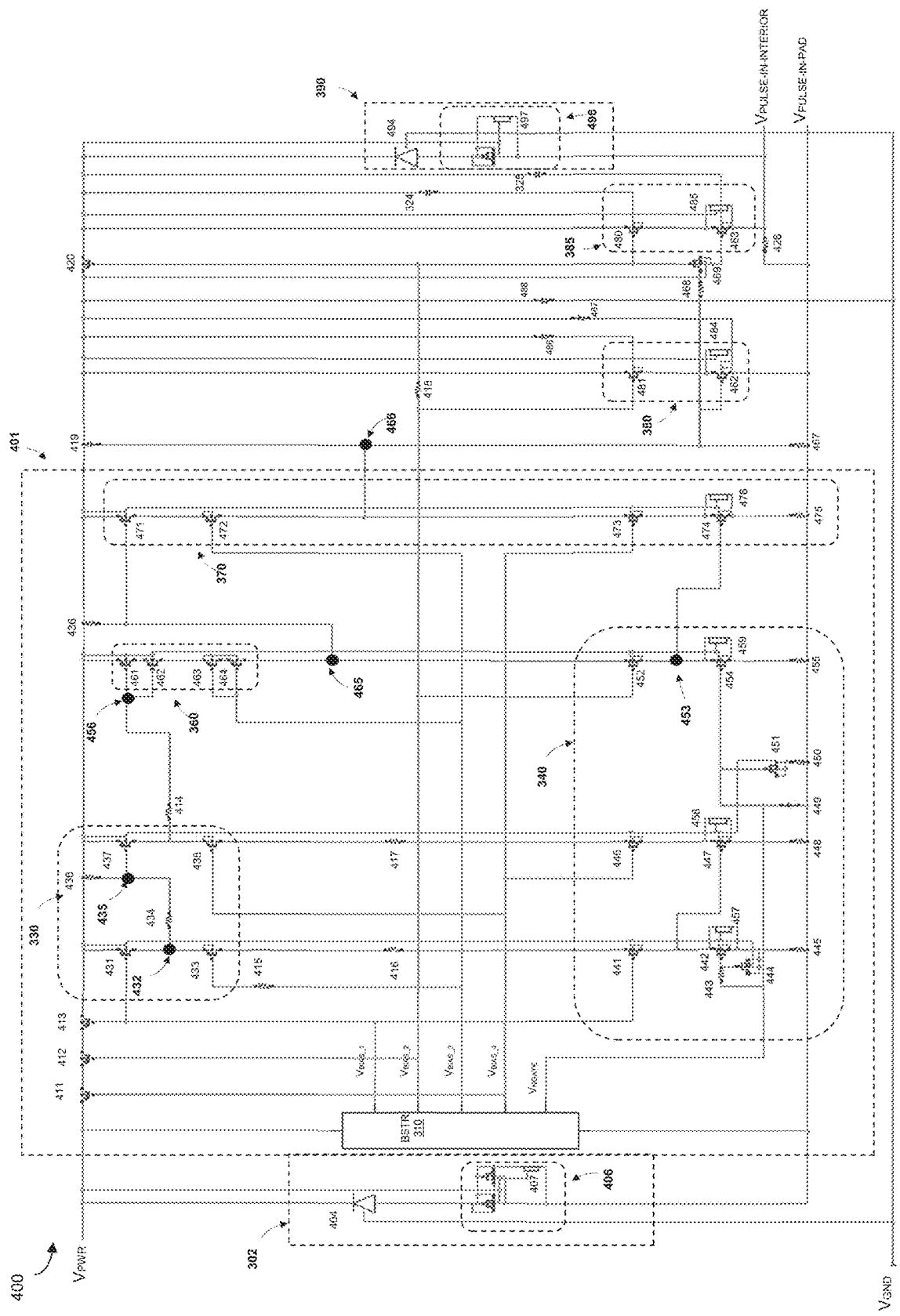
FIG. 4 is a schematic block diagram depicting an example embodiment of the ESD protection clamp 300 of FIG. 3, according to some embodiments.

FIG. 4 is a schematic block diagram depicting an example embodiment of the ESD protection clamp 300 of FIG. 3, according to some embodiments. The ESD protection clamp 300 may include one or more stages, such as a PPV protection clamp 302, a controller 401, a PNV protection clamp 380, an SNV protection clamp 385, and/or an SPV protection clamp. The controller 401 may include one or more stages, such as a BSTR circuit 310, a PFET control circuit 330, an NFET control circuit 340, a gate driver pre-stage circuit 360, and/or a clamp gate driver circuit 370. In some embodiments, the ESD protection clamp 300 may include additional components (e.g., resistors, capacitors, inductors, diodes, transistor, etc.) that are coupled between one or more of the stages of the ESD protection clamp 300.

As shown, the PPV protection clamp 302 includes a P+ in N-Well diode 404 having a cathode terminal coupled to a positive power supply (shown in FIG. 4 as, $V_{PWR}$), and an anode terminal coupled to a cathode terminal of a diode element 406. Diode element 406's anode terminal is coupled to a negative/positive pin (shown in FIG. 4, as $V_{PULSE-IN-PAD}$). In some embodiments, the diode element 406 may include one or more NFET transistors (e.g., NFET 50/1.2) that are each arranged to operate as a diode, such that the one or more NFET transistors provide a diode perimeter having 200 um of N+ adjacent to P+ in P-well. The gates of these NFET diodes are connected to the NFET diodes' cathodes.

The BSTR circuit 310 includes a power terminal coupled to $V_{PWR}$ and a negative terminal coupled to a $V_{PULSE-IN-PAD}$. The BSTR circuit 310 includes a first output terminal (shown in FIG. 4, as $V_{BIAS\_1}$) coupled to a first terminal of capacitor 413, a gate terminal of PFET 431, and a gate terminal of NFET 441. The BSTR circuit 310 includes a second output terminal (shown in FIG. 4, as $V_{BIAS\_2}$) coupled to a first terminal of capacitor 412, a gate terminal of NFET 452, a gate terminal of NFET 481, and a first terminal of resistor 418. The BSTR circuit 310 includes a third output terminal (shown in FIG. 4, as $V_{BIAS\_3}$) coupled to a first terminal of resistor 415, a gate terminal of PFET 463, a gate terminal of PFET 464, and a gate terminal of PFET 472. The BSTR circuit 310 includes a fourth output terminal (shown in FIG. 4, as $V_{BIAS\_4}$) coupled to a first terminal of capacitor 411, a gate terminal of PFET 438, a gate terminal of NFET 446, and a gate terminal of NFET 473. The BSTR circuit 310 includes a fifth output terminal (shown in FIG. 4, as $V_{NGATE}$) coupled to a first terminal of resistor 443, a first terminal of capacitor 449, a first terminal of NFET capacitor 451, and a gate terminal of NFET 454.

The PFET control circuit 330 includes PFET 431, PFET 433, PFET 437, PFET 438, resistor 434, resistor 436, node 432, and node 435. The PFET 431 includes a drain terminal coupled to $V_{PWR}$ and a drain terminal coupled to node 432. The PFET 433 includes a gate terminal coupled to a second terminal of resistor 415, a drain terminal coupled to node 432, and a drain terminal coupled to a second terminal of resistor 416. The resistor 434 includes a first terminal coupled to node 432 and a second terminal coupled to node 435. The resistor 436 includes a first terminal coupled to node 435 and a second terminal coupled to $V_{PWR}$. The PFET 437 includes a gate terminal coupled to the node 435, a drain terminal coupled to $V_{PWR}$, and a drain terminal coupled to a drain terminal of PFET 438 and a first terminal of resistor 414, whose second terminal is coupled to node 456. A drain terminal of PFET 438 is coupled to a second terminal of resistor 417.

The NFET control circuit 340 includes NFET 441, NFET 442, NFET 446, NFET 447, NFET 452, NFET 454, resistor 443, resistor 445, resistor 448, resistor 450, resistor 455, NFET capacitor 444, capacitor 449, and NFET capacitor 451. The NFET 441 includes a drain terminal coupled to a first terminal of resistor 416, a source terminal coupled to a drain terminal of NFET 442 and a gate terminal of NFET 447. The NFET 442 includes a gate terminal coupled to a second terminal of resistor 443 and a first terminal of NFET capacitor 444. The NFET 442 includes a source terminal coupled to a second terminal of NFET capacitor 444 and a first terminal of resistor 445, whose second terminal is coupled to $V_{PULSE-IN-PAD}$.

The NFET 447 includes a drain terminal coupled to a source terminal of NFET 446 and a source terminal coupled to a first terminal of resistor 448, whose second terminal is coupled to $V_{PULSE-IN-PAD}$. The NFET 446 includes a drain terminal coupled to a second terminal of resistor 417 and a source terminal coupled to a drain terminal of NFET 447. The NFET 454 includes a drain terminal coupled to node 453 and a source terminal coupled to a first terminal of resistor 455, whose second terminal is coupled to $V_{PULSE-IN-PAD}$. The NFET 452 includes a drain terminal coupled to node 465 (sometimes referred to as, "Node A") and a source terminal coupled to node 453.

The gate driver pre-stage circuit 360 includes PFET 461, PFET 462, PFET 463, and PFET 464. The PFET 461 includes a gate terminal coupled to node 456, a source terminal coupled to $V_{PWR}$, and a drain terminal coupled to a source terminal of PFET 462. The PFET 462 includes a gate terminal coupled to node 456 and a drain terminal coupled to a source terminal of PFET 463. The PFET 464 includes a source terminal coupled to a drain terminal of PFET 463 and a drain terminal coupled to node 465. The node 465 is coupled to a first terminal of resistor 436, whose second terminal is coupled to $V_{PWR}$.

The clamp gate driver circuit 370 includes PFET 471, PFET 472, NFET 473, NFET 474, and resistor 475. The PFET 471 includes a gate terminal coupled to node 465, a source terminal coupled to $V_{PWR}$, and a drain terminal coupled to a source terminal of PFET 472. The PFET 472 includes a gate terminal coupled to $V_{BIAS\_3}$ and a drain terminal coupled to node 466 (sometimes referred to as, "Node B") and a drain terminal of NFET 473, whose source terminal is coupled to a drain terminal of NFET 474. The NFET 474 includes a gate terminal coupled to node 453 and a source terminal coupled to a first terminal of resistor 475, whose second terminal is coupled to $V_{PULSE-IN-PAD}$. The node 466 is coupled to a first terminal of resistor 419, whose second terminal is coupled to $V_{PWR}$. The node 466 is coupled to a first terminal of resistor 467, whose second terminal is coupled to $V_{PULSE-IN-PAD}$.

The PNV protection clamp 380 includes NFET 481 and NFET 482. The NFET 481 includes a gate terminal coupled to a first terminal of resistor 418, a drain terminal coupled to $V_{PWR}$, and a source terminal coupled to a drain terminal of NFET 482. The NFET 482 includes a source terminal coupled to $V_{PULSE-IN-PAD}$ and a gate terminal coupled to node 466, a first terminal of resistor 468, and the first terminal of resistor 467. A second terminal of resistor 468 is coupled to a drain terminal of NFET 469. The NFET 469 includes a gate terminal coupled to a gate terminal of NFET 480, a second terminal of resistor 418, and a first terminal of capacitor 420. The first capacitor 420 includes a second terminal coupled to $V_{PWR}$.

The SNV protection clamp 385 includes NFET 480 and NFET 483. The NFET 480 includes a drain terminal coupled to $V_{PWR}$ and a source terminal coupled to a drain terminal of NFET 483. The NFET 483 includes a gate terminal coupled to a source terminal of NFET 469 and a source terminal coupled to a second terminal of resistor 426 and a negative/positive pin (shown in FIG. 4, as $V_{PULSE-IN-INTERIOR}$). The resistor 426 includes a first terminal coupled to $V_{PULSE-IN-INTERIOR}$.

The SPV protection clamp 390 includes a P+ in N-Well diode 494 having a cathode terminal coupled to $V_{PWR}$, and an anode terminal coupled to a cathode terminal of a diode element 496. Diode element 496's anode terminal is coupled to $V_{PULSE-IN-INTERIOR}$. In some embodiments, the diode element 496 may be an NFET arranged to operate as a diode. In some embodiments, $V_{PULSE-IN-INTERIOR}$ may correspond to the signal path coming from the negative/positive pin, (e.g., $V_{Pulse-In}$ and $V_{PULSE-IN-PAD}$) and going to the interior of the chip. These negative/positive pin signals are shown in FIG. 3 and FIG. 4.

During normal operation, the $V_{PULSE-IN-INTERIOR}$ signal carries nearly the same information as does the negative/positive pin (e.g., $V_{Pulse-In}$ and $V_{PULSE-IN-PAD}$). However, in a positive voltage ESD event, the large positive ESD event voltages that appear on the $V_{PULSE-IN-PAD}$ signal line are inhibited from entering the chip through the $V_{PULSE-IN-INTERIOR}$ signal line. The $V_{PULSE-IN-INTERIOR}$ signal acts as a filtered and voltage-limited (protected) version of the $V_{PULSE-IN-PAD}$ signal.

The combination of resistor 426, and SPV protection clamp 390's diodes 494, and 496 provide this positive voltage limiting function. Resistor 426 limits the flow of current from the $V_{PULSE-IN-PAD}$ signal line to the $V_{PULSE-IN-INTERIOR}$ signal line. The current, that resistor 426 does allow to pass from the $V_{PULSE-IN-PAD}$ signal line to the $V_{PULSE-IN-INTERIOR}$ signal line, is shunted from the $V_{PULSE-IN-INTERIOR}$ signal line to the $V_{PWR}$ node before excessive positive voltage can build up on the $V_{PULSE-IN-INTERIOR}$ signal line. In some embodiments, the chip's $V_{PWR}$ node can be clamped to the chip's $V_{GND}$ (ground) node through various forms of power supply clamps. In this way, positive voltage on the $V_{PULSE-IN-INTERIOR}$ signal line is directly clamped to the $V_{PWR}$ node and is also indirectly, but effectively clamped to the chip's $V_{GND}$ (ground) node.

The majority of the devices shown in FIG. 4, PFETs, NFETs, diodes, and resistors, are isolated from the substrate by insulators or by diodes. The PFET devices reside in N-wells that keep the P+ sources and drains from contacting the P-type substrate. During the product's normal operation, the voltages on the N-wells are kept at the same values or higher values than the voltages on the PFET sources and drains, and on the P-type substrate. The NFET devices reside in P-wells, that themselves reside in N-wells. The P-wells keep the NFET N+ sources and drains from contacting the P-wells, and the N-wells keep the P-wells from contacting the P-type substrate. During the product's normal operation, the voltages on the NFETs' N-wells are kept at the same values or higher values than the voltages on the P-type substrate, and higher than the voltages on the NFET's P-wells. During the product's normal operation, the voltages on the NFETs' P-wells are kept at the same values or lower values that the voltages on the NFETs' N+ sources and drains. Similarly, the other diodes in the circuit are kept at zero bias or else are kept reversed biased. In this way, the devices in the circuit can go to negative voltages without causing forward biased diode currents to flow.

Diode 404 is a P+ to N+ diode in N-well. In addition to the diode's previously mentioned connections, the diode symbol has a side connection from the diode to $V_{GND}$. This connection is used in circuit simulation to provide a parasitic N-well to P-substrate diode for the simulator. Devices 406 are parallel NFETs residing in P-well, residing in N-well. The devices act as diodes and have their gates and sources and drains coupled together. The gates and sources and drains of device 406 are connected to the cathode of diode 404. Device 404's P-well is coupled to the $V_{PULSE-IN-PAD}$, while its N-well is coupled to $V_{PWR}$. Transistor capacitors 411, 412, 413, and 420 are capacitors made from PFET transistors. The N-wells in which the capacitors reside are coupled to $V_{PWR}$. PFETs 431, 437, 461, 462, and 471, have their N-wells coupled to $V_{PWR}$. PFETs 433, 438, 463, and 472 each have their respective N-wells coupled to their respective sources. PFET 464 has its N-well coupled to the source of PFET 463.

NFETs 441, 442, 446, 447, 452, 454, 473, 474, and 469, all have their P-wells coupled to their respective sources and their N-wells are coupled to $V_{PWR}$. NFETs 444, and 451, configured as gate oxide capacitors, have their P-wells coupled to their respective sources and their N-wells are coupled to $V_{PWR}$. NFET ESD protection clamp transistors 481, 482, 483, and 484 each have their P-wells coupled to their respective sources and their N-wells coupled to $V_{PWR}$. (the N-wells are not shown in the schematic symbols for these devices and the N-wells are not shown on FIG. 4).

Diode 494 is a P+ to N+ diode in N-well. In addition to the diode's previously mentioned connections, the diode symbol has a side connection from the diode to $V_G$ND. This connection is used in circuit simulation to provide a parasitic N-well to P-substrate diode for the simulator. Devices 496 is an NFET residing in P-well, residing in N-well. The device acts as a diode and has its gate, source and drain coupled together. The gate, source and drain of device 496 are connected to the cathode of diode 494. Device 494's P-well is coupled to $V_{PULSE-IN-INTERIOR}$, while its N-well is coupled to $V_{PWR}$.

Items 407, 457, 458, 459, 476, 484, 485, and 497 are parasitic devices in the schematic that are used for aiding circuit simulation. They are not explicitly placed in the actual circuit. Similarly, devices 324, 325, 486, 487, and 488 are parasitic devices in the schematic that are used for aiding circuit simulation. They are not explicitly placed in the actual circuit.

Still referring to FIG. 4, the ESD protection clamp 400 may be triggered (e.g., prompted, started, initiated) and/or controlled by BSTR circuit 310, which may include one or more bias strings and a trigger resistor (e.g., a polysilicon resistor). The trigger resistor, in some embodiments, may have a value of 220K ohm+/−20%. In normal operation, the one or more bias strings and the trigger resistor may each conduct no, or a negligible amount, of current. In some embodiments, the voltage across the trigger resistor may be small (e.g., 1 ohm to 1 kilo ohm). In some embodiments, the gate to source voltages ($V_{GS}$) of NFETs 454, 442 of the NFET control circuit 340, may be low (e.g., lower than their respective threshold voltages), such that they are each off (e.g., disabled, deactivated).

In some embodiments, with negative voltage ESD pulses to the positive/negative pin (e.g., $V_{PULSE-IN-PAD}$), the voltage from the top to the bottom of the transistors in the one or more bias strings may increase current flow through the trigger resistor. In some embodiments, the voltage across the resistor may increase beyond a predetermined threshold value, such to turn on (e.g., enable, activate) NFETs 454, 442.

Turning on NFET 442, in some embodiments, may quickly turn off (e.g., disable, deactivate) the P channel pull ups (e.g., PFETs 461, 462) in the gate driver pre-stage circuit 360. Along with using the signal path via NFET 454 to turn on the ESD protection clamps (481, 482, 480, and 483) it is advantageous to simultaneously use a second separate signal path via NFETs 442, 441, 447 and 446 and PFETs 433, 431, 438, and 437 to cause PFETs 461 and 462 to turn off more quickly than they otherwise would. Using the dual path approach significantly increases the speed with which clamping and the turn on of NFETs 481, 482, 480, and 483 takes place. The dual path approach is also applied from node 465 to PFET 471 and node 453 to NFET 474. In some embodiments, coincident and/or responsive to NFET 442 turning on, NFET 454 may turn on and pull down node 465 ("Node A") and/or the other nodes in the gate driver pre-stage circuit 360 to a lower voltage (or zero). This two-path approach, takes advantage of methods similar to those used in differential signaling and in differential sensing.

In some embodiments, node 465 ("Node A") may quickly pull down to a lower voltage (or zero) due to the cascoding effects of NFET 452 of the NFET control circuit 340, and PFETs 463 464 of gate driver pre-stage circuit 360.

In some embodiments, pulling down the voltage of node 465 to a lower voltage may cause the PFETs 471, 472 of the clamp gate driver circuit 370 to pull up the voltage of node 466 to a higher voltage, and pull up the gate of NFET 482 in the PNV protection clamp 380, and pull up the gate of NFET 483 in the SNV protection clamp 385 to a higher voltage; thereby causing the PNV protection clamp 380 and the SNV protection clamp 385 to turn on and clamp. In some embodiments, clamping means that the ESD protection clamp 300 provides a discharge path for an ESD event that happens between the negative/positive $V_{PULSE-IN-PAD}$ and the positive power rail of the chip, such as to prevent the ESD event from damaging one or more circuits of the chip that are associated with and/or coupled to the protected pin (e.g. coupled to the negative/positive $V_{PULSE-IN-PAD}$).

In some embodiments, the cascoding of the clamp's various stages (e.g., PFET cascode pair 471 with 472; NFET cascode pair 473 with 474; PFET cascode pair stage 360; and NFET cascode pair 473 with 474) adds to the abruptness of the clamp turn on by increasing and/or amplifying the gains of the stages.

In some embodiments, cascoding the NFETs and or the PFETs in the stages, leading to node 466, takes advantage of higher cascode circuit gains in the stages, and, moreover, avoids (or mitigates) violations of gate to source voltage limits in the individual NFETs and PFETs.

Although it is known that cascoding of clamp transistors, the transistors specifically used to directly pass ESD event currents from pins to ground, from pins to power supply nodes, and from power supply nodes to ground (e.g. transistors 481, 482, 480, and 483 of FIG. 4), has previously been used, it is believed that cascoding of the transistors in the circuitry that is used to control (e.g. turn on and turn off) clamp transistors, is novel and unique.

3. Bias String and Trigger Resistor (BSTR) Circuit

Figure 5:
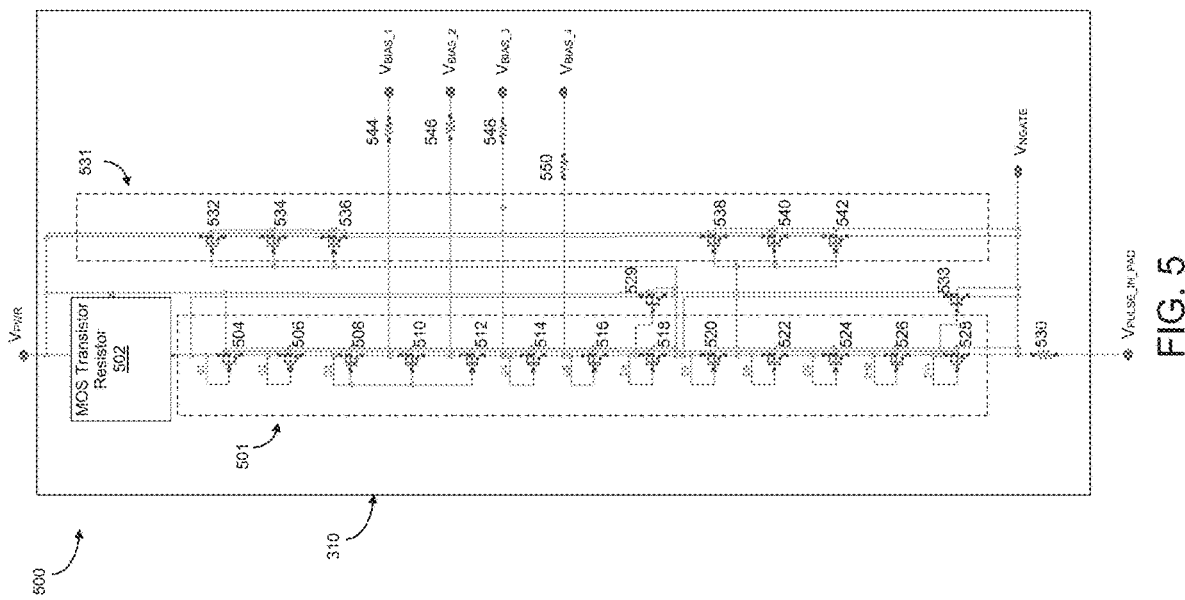
FIG. 5 is a schematic block diagram depicting an example embodiment of the BSTR circuit 310 of FIG. 4, according to some embodiments.

FIG. 5 is a schematic block diagram depicting an example embodiment of the BSTR circuit 310 of FIG. 4, according to some embodiments. The BSTR circuit 310 includes a MOS-Transistor Resistor 502; a transistor bias string 501 (sometimes referred to as, "first transistor bias string"); a transistor bias string 531 (sometimes referred to as, "second transistor bias string"); NFETs 529, and 533; and resistors 530, 544, 546, 548, 550. The transistor bias string 501 includes NFETs 504, 506, 508, 510, 512, 514, 516, 518, 520, 522, 524, 526, and 528. The transistor bias string 531 includes NFETs 532, 534, 536, 538, 540, and 542. In some embodiments, the transistor bias string 501 may correspond to a string of diode-connected NFETs. In some embodiments, the transistor bias string 531 may correspond to a string of diode-connected NFETs.

The MOS-Transistor Resistor 502 (e.g., comprised of one or more NFETs and or PFETs) includes a first terminal coupled to $V_{PWR}$ and a second terminal coupled to a drain terminal of NFET 504. The drain terminal of NFET 504 is coupled to a gate terminal of NFET 504. A source terminal of NFET 504 is coupled to a drain terminal of NFET 506. The drain terminal of NFET 506 is coupled to a gate terminal of NFET 506. A source terminal of NFET 506 is coupled to a drain terminal of NFET 508.

The drain terminal of NFET 508 is coupled to a gate terminal of NFET 508. A source terminal of NFET 508 is coupled to a drain terminal of NFET 510 and a first terminal of resistor 544, whose second terminal corresponds to a first output terminal (shown in FIG. 5, as $V_{BIAS\_1}$). The gate terminal of 510 is coupled to the gate terminal of NFET 508. The source terminal of NFET 510 is coupled to a drain terminal of NFET 512 and a first terminal of resistor 546, whose second terminal corresponds to a second output terminal (shown in FIG. 5, as $V_{BIAS\_2}$).

The source terminal of NFET 512 is coupled to the drain terminal of NFET 514 and the first terminal of resistor 548, whose second terminal corresponds to a third output terminal (shown in FIG. 5, as $V_{BIAS\_3}$). The drain terminal of NFET 514 is coupled to a gate terminal of NFET 514. A source terminal of NFET 514 is coupled to a drain terminal of NFET 516 and a first terminal of resistor 550, whose second terminal corresponds to a fourth output terminal (shown in FIG. 5, as $V_{BIAS\_4}$).

The drain terminal of NFET 516 is coupled to a gate terminal of NFET 516. A source terminal of NFET 516 is coupled to a drain terminal of NFET 518 and a gate terminal of NFET 529. The drain terminal of NFET 518 is coupled to a gate terminal of the NFET 518. A source terminal of NFET 518 is coupled to a drain terminal of NFET 520, a source terminal of NFET 529, a gate terminal of NFET 532, a gate terminal of 534, and a gate terminal of 536. The drain terminal of NFET 520 is coupled to a gate terminal of NFET 520. A source terminal of NFET 520 is coupled to a drain terminal of NFET 522, a gate terminal of NFET 538, a gate terminal of NFET 540, and a gate terminal of NFET 542.

The drain terminal of NFET 522 is coupled to a gate terminal of NFET 522. A source terminal of NFET 522 is coupled to a drain terminal of NFET 524. The drain terminal of the NFET 524 is coupled to a gate terminal of NFET 524. A source terminal of NFET 524 is coupled to a drain terminal of NFET 526. The drain terminal of NFET 526 is coupled to a gate terminal of NFET 526. A source terminal of NFET 526 is coupled to a drain terminal of NFET 528 and a gate terminal of NFET 533. The drain terminal of NFET 528 is coupled to a gate terminal of NFET 528.

A source terminal of NFET 528 is coupled to a first terminal of resistor 530 (sometimes referred to as, "trigger resistor") and a fifth output terminal (shown in FIG. 5, as $V_{NGATE}$). The second terminal of resistor 530 corresponds to a negative/positive pin (shown in FIG. 5, as $V_{PULSE-IN-PAD}$).

The drain terminal of NFET 529 is coupled to the second terminal of MOS-Transistor Resistor 502. The source terminal of NFET 518 is coupled to a drain terminal of NFET 533, whose source terminal is coupled to $V_{NGATE}$. The drain terminal of the NFET 532 is coupled to a positive power supply (shown in FIG. 5 as, $V_{PWR}$). A source terminal of NFET 532 is coupled to a drain terminal of NFET 534, whose source terminal is coupled to a drain terminal of NFET 536.

The source terminal of NFET 536 is coupled to a drain terminal of NFET 538, whose source terminal is coupled to a drain terminal of NFET 540. The source terminal of NFET 540 is coupled to a drain terminal of NFET 542, whose source terminal is coupled to $V_{NGATE}$. The gate terminal of NFET 538 is coupled to the gate terminal of NFET 540 and the gate terminal of NFET 542.

NFETs 504, 506, 508, 510, 512, 514, 516, 518, and 529 all have their P-wells coupled to the source of NFET 518 which is also the source of NFET 529. The NFET N-wells are coupled to $V_{PWR}$. NFETs 520, 522, 524, 526, and 528 all have their P-wells coupled to the source of NFET 528 which is also $V_{NGATE}$. The NFET N-wells are coupled to $V_{PWR}$. NFETs 532, 534, and 536 all have their P-wells coupled to the source of NFET 536. The NFET N-wells are coupled to $V_{PWR}$. NFETs 533, 538, 540, and 542 all have their P-wells coupled to the source of NFET 542 which is also $V_{NGATE}$. The NFET N-wells are coupled to $V_{PWR}$.

3.1 Clamp Bias Strings

Still referring to FIG. 5, the clamp may be triggered and/or controlled by the transistor bias string 501 and the transistor bias string 531 (collectively referred to as, "transistor bias strings 501, 531") and resistor 530 (e.g., a series poly silicon trigger resistor) that, together, connect from the chip's internal positive power supply (e.g., $V_{PWR}$) to the negative/positive pin (e.g., $V_{PULSE-IN-PAD}$). In some embodiments, the trigger resistor 530 may be placed at the bottom of the transistor bias strings 501, 531. In some embodiments, the transistor bias strings 501, 531 provide current to the trigger resistor 530.

In some embodiments, the transistor bias strings 501, 531 may compensate each other for changes in transistor threshold voltages and/or current gain factors. For example, compensation may occur as temperature and/or semiconductor manufacturing process (e.g., transistor threshold voltages, sheet row, etc.) changes bring and/or cause current in one string to rise while the changes bring and/or cause the current in the other string to fall; thereby causing the changes in current to counteract (e.g., cancel, neutralize).

In some embodiments, eleven diode-connected (e.g., gate connected to drain) N-channel transistors (or transistor groups) may be connected in series to form the body of the transistor bias string 501. In some embodiments, as shown in FIG. 5, the transistor bias string 501 is topped by a MOS-based "resistor" (e.g., MOS-Transistor Resistor 502) that is formed by N-channel MOSFETs. In some embodiments, the MOS-Transistors Resistor 502 has an impedance that ranges from 1 megaohm ($1\times10^6$) to 10 megaohms depending upon the voltage across the "resistor." In some embodiments, the "resistor" may be non-linear. In some embodiments, a MOSFET, as discussed herein, may refer to an Insulated Gate Field Effect Transistor (IGET), an NFET, or a PFET.

In some embodiments, the transistor bias string 501 provides controlling gate voltages to the transistors in the transistor bias string 531.

In some embodiments, as the transistor bias string 501 has multiple threshold voltage drops in series, and as the transistor bias string 531 merely has single gate to source voltage drops, the changes in the voltages of transistor bias string 501 may overcome the threshold voltage changes in the transistor bias string 531. Specifically, in some embodiments, when increases in threshold voltages reduce current flow in the transistor bias string 501, the increased drain to source voltages (e.g., increases that are caused by the threshold voltage increases) of the transistor bias string 501, may raise the voltages on the gates of the six transistors of the transistor bias string 531 and cause those transistors to increase current flow. The overall effect is that the change in the current through the trigger resistor 530 is smaller than it would be if the combination of the transistor bias strings 501, 531 was not used.

In some embodiments, changes in the current through the transistor bias string 531 may at least partially compensate changes in the current through the transistor bias string 501. These changes may be brought about as the process changes (e.g., over changes in threshold voltages and/or over changes in transistor current gain factors, such as mobility, gate oxide capacitance, channel length, channel width, etc.). In some embodiments, compensation may occur as changes in the current flowing through the transistor bias string 501 may at least partially compensate changes in the current flowing through the transistor bias string 531.

In some embodiments, current flow changes in the transistor bias string 531, that are caused by temperature changes, may at least partially compensate current flow changes in the transistor bias string 501 that are caused by temperature changes. In some embodiments, temperature changes may bring about changes in transistor threshold voltages and/or changes in transistor current gain factors (e.g., mobility, etc.).

Similarly, in some embodiments, current flow changes in both bias strings (e.g., transistor bias strings 501, 531) can result from variations in processing. Again, the current flow changes in the transistor bias string 531, may at least partially compensate current flow changes in the transistor bias string 501. In some embodiments, changes in a current through a transistor bias string may stem from changes in the threshold voltages of the transistors in the transistor bias string. In some embodiments, threshold voltage changes can be caused by process variations.

Such threshold voltage changes, and other device parameter changes, that are caused by process variations are generally the same in all of the transistors on a chip of a given type and size of transistor. So, the process induced changes in the transistors of the second bias string, in some embodiments, may be the same as the process induced changes in the transistors of the first bias string.

When the ESD protection clamp 300 is subjected to increased threshold voltages, such as in a "Slow N channel with Slow P channel" process "corner" situation, or such as when temperature drops, the gate to source voltages (and the drain to source voltages) of the lower four NFETs (e.g., NFETs 522, 524, 526, and 528) in the transistor bias string 501 increase and raise the gate voltages of the three lower transistors (e.g., NFETs 538, 540, and 542) in the transistor bias string 531.

Similarly, in some embodiments, the gate to source voltages (and the drain to source voltages) of the lower five NFETs (e.g., NFETs 520, 522, 524, 526, and 528) in the transistor bias string 501 increase and raise the gate voltages of the three upper transistors (e.g., NFETs 532, 534, and 536) in the transistor bias string 531. In this way, current reductions in the transistor bias string 501, that are induced by threshold voltage increases in the transistors of the transistor bias string 501, may at least partially be compensated by increased currents in the transistors of the transistor bias string 531. In some embodiments, the current increases in the transistors of the transistor bias string 531 may be induced by the gate voltage increases applied to the transistors of the transistor bias string 531 by the transistors of the transistor bias string 501.

In some embodiments, as the transistor bias string 501 has multiple threshold voltage drops in series, and as the transistor bias string 531 merely has single gate to source voltage drops, the changes in the threshold voltages of transistor bias string 501 may overcome the threshold voltage changes in the transistor bias string 531.

Moreover, in some embodiments, anything that causes increased voltage drops across the drain to source voltages of the transistors in the transistor bias string 501 (e.g., mobility reductions, decreased gate oxide capacitances, increased gate oxide thicknesses, increased channel doping, increased channel lengths, decreased channel widths, etc.), may cause increases to the gate voltages of the transistors in the transistor bias string 531. These increased gate voltages, to the gates of the transistors in the transistor bias string 531 may cause the transistors of the transistor bias string 531 to increase their currents. This current increase may compensate, at least partially, the decrease in current in the transistor bias string 501.

Analogously but in a mirror image fashion, "Fast N channel with Fast P channel" process "corner" threshold voltage reductions and/or current increases may also be at least partially compensated in the transistor bias strings 501, 531.

Analogously but in a mirror image fashion to the situation when temperature drops, the currents in the transistor bias strings 501, 531 may compensate each other when temperature rises. For example, rising temperatures may decrease the magnitudes of transistor threshold voltages and decrease transistor mobilities. Through decreased transistor mobilities, rising temperatures decrease transistor currents.

3.2 Using NFETs and PFETs to Provide an MOS-Transistor Resistor (502)

Figure 6:
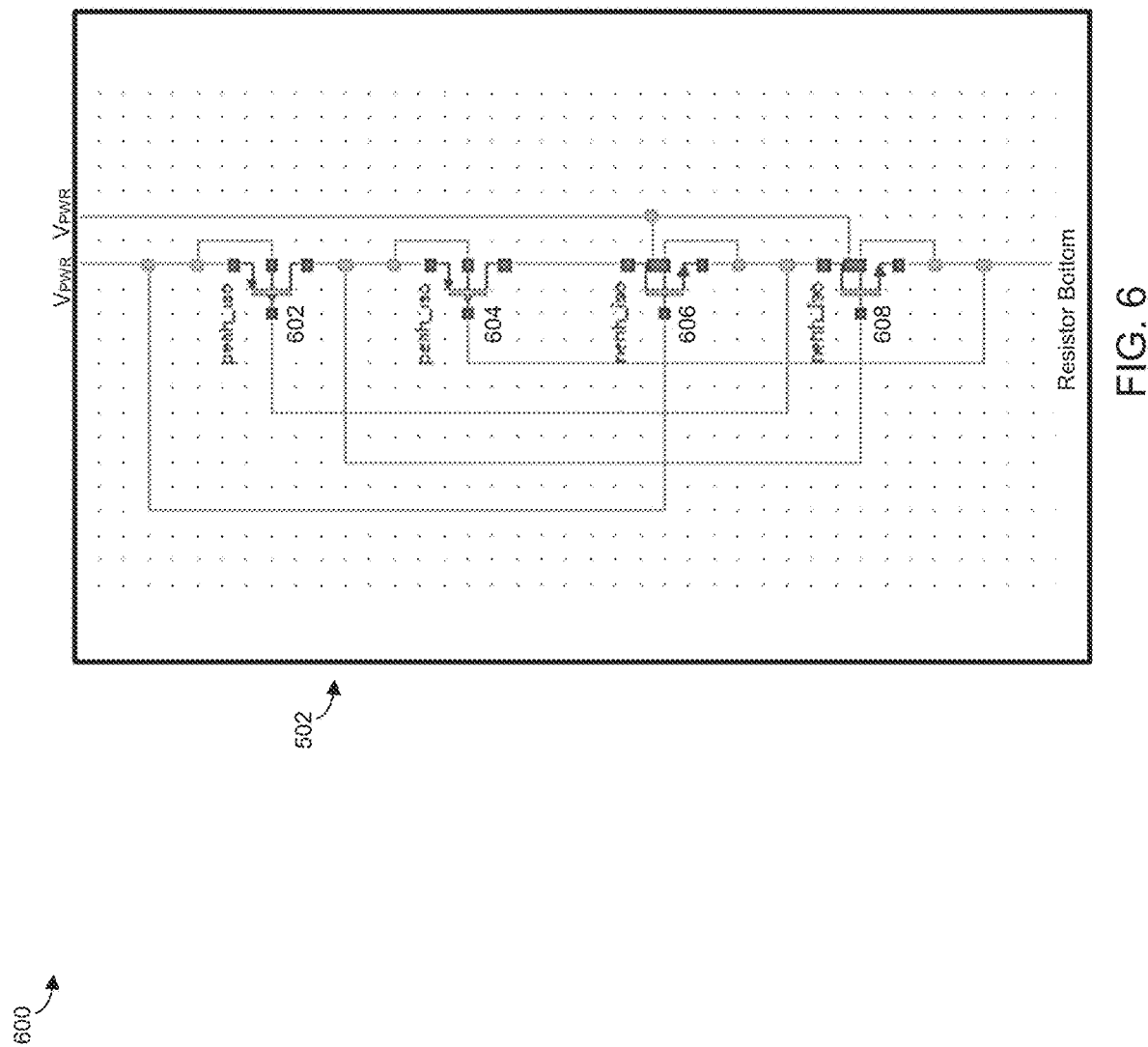
FIG. 6 is a schematic block diagram depicting an example embodiment of the MOS-Transistor Resistor 502 of FIG. 5, according to some embodiments.

FIG. 6 is a schematic block diagram depicting an example embodiment of the MOS-Transistor Resistor 502 of FIG. 5, according to some embodiments. The MOS-Transistor Resistor 502 includes PFETs 602, 604 and NFETs 606, 608. The source terminal of PFET 602 is coupled to $V_{PWR}$ and a drain terminal of PFET 602 is coupled to a source terminal of PFET 604. A drain terminal of PFET 604 is coupled to a drain terminal of NFET 606, whose source terminal is coupled to a drain terminal of NFET 608. The source terminal of NFET 608 may correspond to a bottom of a resistor (e.g., MOS Transistor Resistor 502 in FIG. 5).

The gate terminal of PFET 602 is coupled to a source terminal of NFET 606. A gate terminal of PFET 604 is coupled to a source terminal of NFET 608. A gate terminal of NFET 606 is coupled to $V_{PWR}$. A gate terminal of NFET 608 is coupled to a drain terminal of PFET 602.

PFETs 602 and 604 have their N-wells coupled to VPWR.

NFETs 606 and 608 have their P-wells coupled to their respective sources. The NFET N-wells are coupled to $V_{PWR}$.

3.3 Triggering an ESD Clamp Using a Trigger Resistor

Referring again to FIG. 5 in conjunction with FIG. 6, in some embodiments, during a large negative voltage excursion (sometimes referred to as, "NV-ESD") on a Pulse In Pin (e.g., $V_{PULSE-IN-PAD}$) during an ESD event, the voltage from the top to the bottom of the transistor bias strings 501, 531 increases, current flow may ensue and the voltage across the trigger resistor 530 rises to a voltage that exceeds the threshold voltages of the two NFETs 454 and 442 of the ESD protection clamp, 400 (in FIG. 4). In some embodiments, the voltage across the trigger resistor 530 passes to the gates of NFETs 454 and 442, turning on the transistors. In some embodiments, during large negative voltage excursions during ESD events, the NFETs may be used to drive the clamp circuit into a low impedance clamping mode.

In some embodiments, during normal operation the transistor bias strings 501, 531, and the trigger resistor 530 conduct almost no (or negligible) current. In some embodiments, the current through the trigger resistor 530 may be relatively small (e.g., 0 to 1 microamp).

In some embodiments, the transistor bias string 501 may provide cascode transistor gate biases for the cascode transistors in the rest of the ESD protection clamp 300 (e.g., $V_{BIAS\_1}$ through $V_{BIAS\_4}$).

3.4 Triggering an ESD Clamp without Using a Polysilicon Trigger Resistor

In some embodiments, during normal operation the transistor bias strings 501, 531, and the trigger resistor 530 conduct almost no (or negligible) current. In some embodiments, the current through the trigger resistor 530 may be relatively small (e.g., 0 to 1 microamp).

In some embodiments, it may not be feasible to use a poly silicon resistor 530 in the bias string. Due to its, sometimes relatively low resistance, the normal operation leakage current through a polysilicon resistor may be larger than what is acceptable. The resistance of such a resistor may need to exceed 20 mega ohms in order to provide an acceptable leakage current. In some cases, a 20 mega ohm resistor would require 2,000 squares of 10K ohm poly silicon resistor. This could pose an unacceptable area impact. Nonetheless, because the total leakage current of the bias strings 501 and 531, and the trigger resistor 530, should, in some embodiments, be kept to less than 1 uA with a normal operation bias of 12.85 volts, the string impedance should, in some embodiments, be kept in the 10M ohm range. Such a resistance range may not be feasible using poly silicon resistors, due to the area impact.

Figure 7:
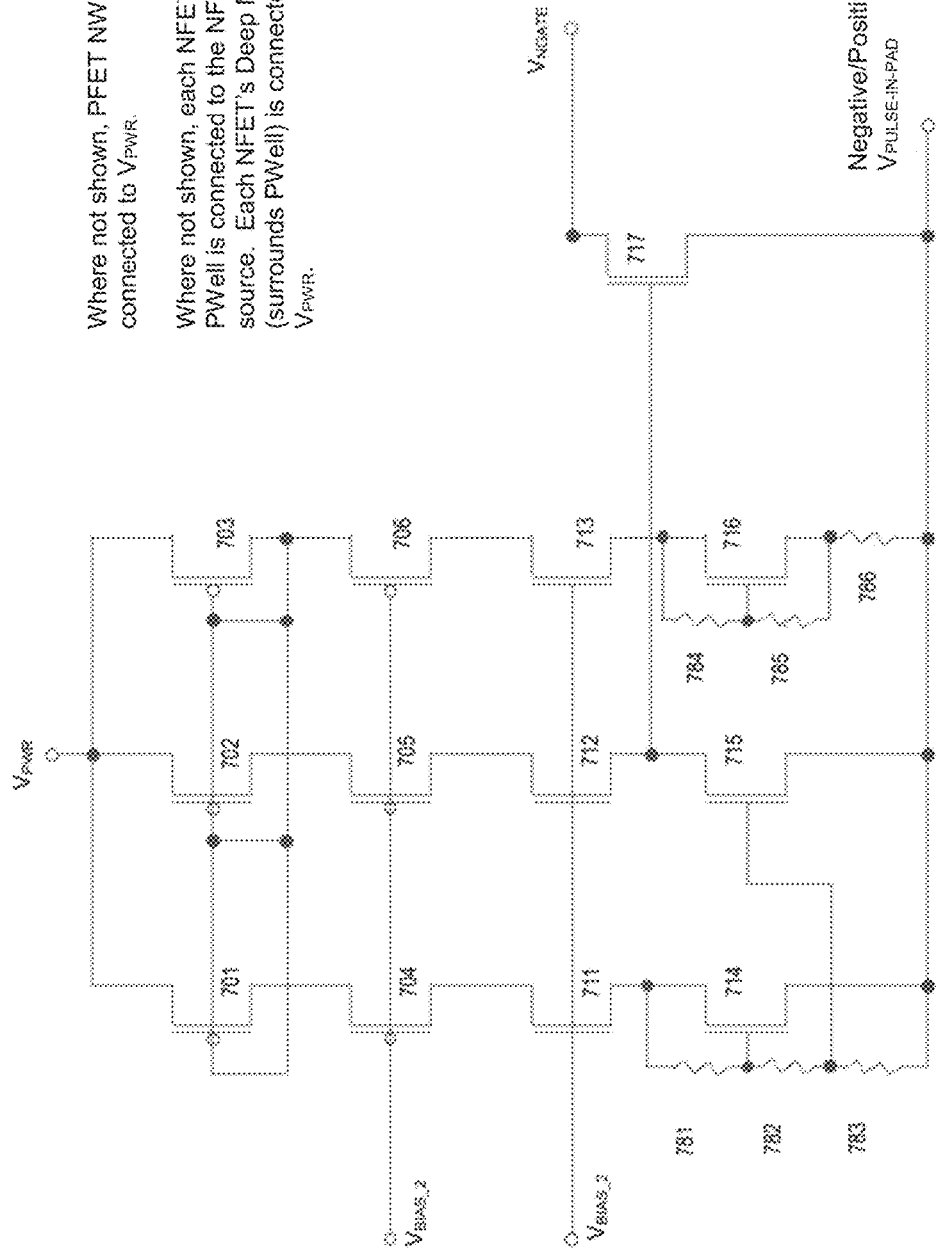
FIG. 7 is a schematic block diagram depicting an example embodiment of the trigger resistor 530 of FIG. 5, according to some embodiments.

FIG. 7 is a schematic block diagram depicting an example circuit 700 of the trigger resistor 530 of FIG. 5, according to some embodiments. In some embodiments, the circuit 700 may replace the trigger resistor 530 in FIG. 5. In those embodiments, with the resistor 530 removed from the circuit of FIG. 5, the drain of NFET 717 of FIG. 7 (also marked $V_{NGATE}$) is connected to the node $V_{NGATE}$ in the circuit of FIG. 5 (which, in FIG. 5, is also the source of NFET 528, the source of NFET 533, and the source of NFET 542). In those embodiments, the source of NFET 717 of FIG. 7 (also marked Negative/Positive Pin and $V_{PULSE-IN-PAD}$ in FIG. 7) is connected to the node $V_{PULSE-IN-PAD}$ in the circuit of FIG. 5. In this way, the circuit of FIG. 7 forms a substitute for the trigger resistor 530 of FIG. 5.

(Although not shown in FIG. 7, PFETs 701, 702, 703, 704, 705, and 706, all have their N-wells coupled to $V_{PWR}$. Also not shown, NFETs 711, 712, 713, 714, 715, 716, and 717, all have their P-wells coupled to their respective sources, and their N-wells coupled to $V_{PWR}$.)

In some embodiments, using a transistor circuit (e.g. circuit 700) as a substitute for resistor 530, can save circuit layout space.

Additionally, in some embodiments, the circuit 700 may make the ESD protection clamp 300 respond more abruptly to changes in total clamp voltage. In some embodiments, the trigger resistor 530 in FIG. 5 may be replaced by the circuit 700 (e.g., by NFET 717).

In some embodiments, using a constant current source (e.g., NFET 717) in circuit 700 in place of the trigger resistor 530 in FIG. 5 may cause the voltage between the $V_{NGATE}$ node and the positive/negative pin (e.g., $V_{PULSE-IN-PAD}$) to rise more quickly with increases in the voltage between $V_{PWR}$ and the positive/negative pin ($V_{PULSE-IN-PAD}$). In other words, with the circuit 700, the value of Equation (1) may be larger than it would be with the trigger resistor 530 in FIG. 5:

$$d(V_{NGATE}-V_{PULSE-IN-PAD})/d(V_{PWR}-V_{PULSE-IN-PAD}) \quad (1)$$

In some embodiments, a third bias string (PFET 703, PFET 706, NFET 713, NFET 716) is used to bias the gates of three P channel current mirror transistors (PFET 703, PFET 702, PFET 701).

In some embodiments, in all three bias strings, the cascode P channel transistors (PFET 704, PFET 705, PFET 706) and the cascode N channel transistors (NFET 711, NFET 712, NFET 713) may be used to limit transistor voltages on PFET 701, PFET 702, PFET 703, NFET 714, NFET 715 and NFET 716.

In some embodiments, a first bias string uses a three-resistor voltage divider (e.g., resistor 781, 782, 783) to drive the gate of NFET 714. In some embodiments, NFET 714 may be a relatively wide and short channel. In some embodiments, NFET 714 is biased to operate with its gate voltage right at its threshold voltage and its drain voltage at several multiples of the threshold voltage (e.g., NFET 714 is in saturation).

In some embodiments, the voltage on the gate of NFET 714 will rise until it begins to turn on. In some embodiments, in order for the gate voltage of NFET 714 to reach a voltage near a threshold voltage of NFET 714, the drain voltage of NFET 714 may rise to several times the threshold voltage of NFET 714. Moreover, the resistor divider (e.g., resistors 781, 782, 783) between the gate of NFET 714 and its source may raise the gate voltage of NFET 715 to a voltage that is just below threshold voltage, to a level that is a large fraction of the threshold voltage of NFET 714.

In some embodiments, NFET 715 may operate in the subthreshold voltage region (e.g., barely on). In some embodiments, as NFET 715 and its series companions (e.g., NFET 712, PFET 705, PFET 702) may be the same sizes as their counterpart transistors (e.g., NFET 711, PFET 704, PFET 701), the NFET 715 may have an elevated drain voltage as compared with the drain voltage of the transistor NFET 714.

In some embodiments, however, as the width of NFET 715 may instead be much wider than the width of NFET 714, the drain voltage of NFET 715 may be considerably smaller than the drain voltage of NFET 714 (e.g. one third of the drain voltage of NFET 715). In some embodiments, the drain voltage of NFET 715 can be adjusted by changing the width of NFET 715. In some embodiments, the drain voltage of NFET 715 can be adjusted to just above the threshold voltage of NFET 717.

In some embodiments, the drain voltage of NFET 715 (which is the gate voltage of NFET 717) may rise as NFET 714's and NFET 717's threshold voltages increase and should fall as NFET 714's and NFET 717's threshold voltages decrease. In this way, the threshold voltage changes in NFET 717 may be compensated by the changes in NFET 717's gate voltage, the gate voltage that NFET 715 and NFET 714 provide. In some embodiments, the gate voltage on NFET 717 may be adjusted to place the NFET 717 in saturation (e.g., a constant current state).

In some embodiments, NFET 717 may replace the trigger resistor 530 in FIG. 5. In some embodiments, NFET 717 may be in a saturated state such that NFET 717 has a constant current behavior, which causes the voltage on the $V_{NGATE}$ node to increase at a much higher rate as the voltage from $V_{PWR}$ to the positive/negative pin increases (voltage from $V_{PWR}$ to $V_{PULSE-IN-PAD}$ increases) (e.g., during a negative voltage ESD event).

Figure 8:
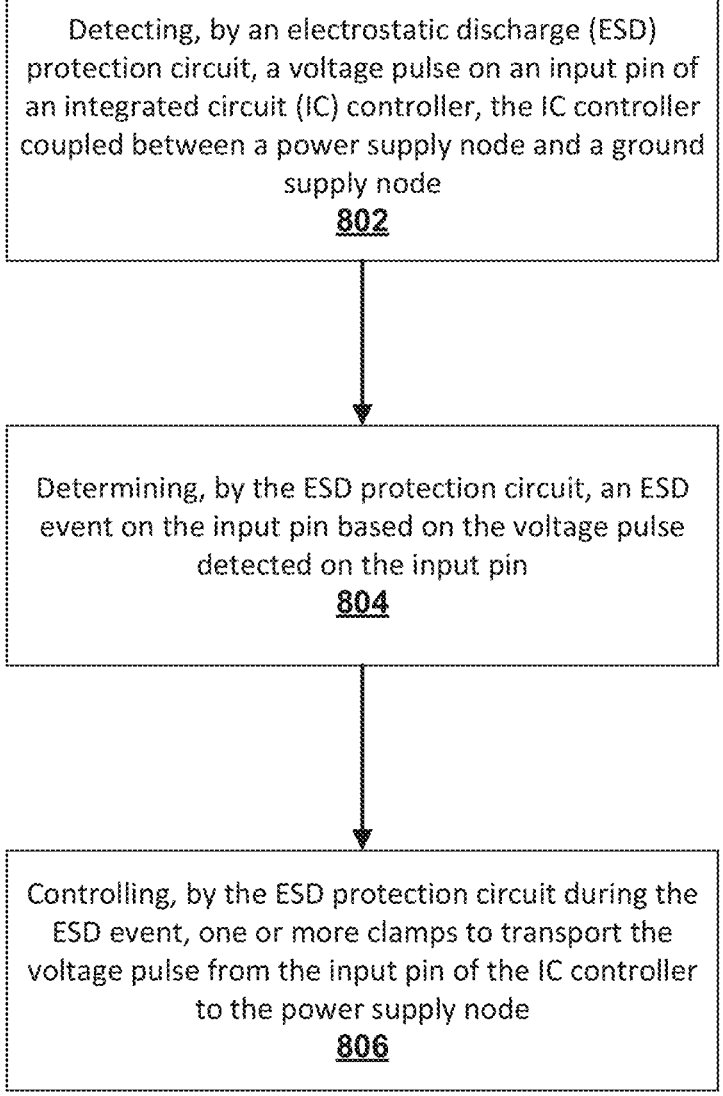
FIG. 8 is a flow diagram of a method of combining positive and negative voltage ESD protection into an ESD protection clamp that uses cascoded circuitry to protect one or more pins of a chip, according to some embodiments.

FIG. 8 is a flow diagram of a method of combining positive and negative voltage ESD protection into an ESD protection clamp that uses cascoded circuitry to protect one or more pins of a chip, according to some embodiments. Although the steps are depicted in FIG. 8 as integral steps in a particular order for purposes of illustration, in other implementations, one or more step, or portions thereof, are performed in a different order, or overlapping in time, in series or parallel, or are omitted, or one or more additional steps are added, or the method is changed in some combination of ways. In some embodiments, the method 800 may be performed by processing logic that comprises hardware (e.g., circuitry, dedicated logic, programmable logic, microcode, etc.), firmware, or a combination thereof. In some embodiments, some or all operations of method 800 may be performed by processing logic included in primary side controller 102 (and/or in startup controller 160 therein) of the AC-DC controller 100 in FIG. 1. In some embodiments, some or all operations of method 800 may be performed by one or more stages and/or components of the ESD protection clamp 300 in FIG. 3. In some embodiments, a primary side controller 102 may be an integrated circuit (IC) controller.

The method 800, in some embodiments, may include the operation 802 of detecting a voltage pulse on an input pin of a primary side controller for an AC-DC converter (e.g., such as a Pulse-In pin of PSC 102 in FIG. 1), wherein the primary-side controller is coupled between a power supply node and a ground supply node. The method 800, in some embodiments, may include the operation 804 of determining an ESD event on the input pin based on the voltage detected on the input pin. The method 800, in some embodiments, may include the operation 806 of controlling, during the ESD event, one or more clamps to transport the voltage pulse from the input pin of the primary side controller to the power supply node.

In the above description, some portions of the detailed description are presented in terms of algorithms and symbolic representations of operations on analog signals and/or digital signals or data bits within a non-transitory storage medium. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the disclosure. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "communicating," "modifying," "measuring," "determining," "detecting," "sending," "comparing," "maintaining," "switching," "controlling," or the like, refer to the actions and processes of an integrated circuit (IC) controller, or similar electronic device, that manipulates and transforms data represented as physical (e.g., electronic) quantities within the controller's registers and memories into other data similarly represented as physical quantities within the controller memories or registers or other such information non-transitory storage medium.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment"

throughout is not intended to mean the same embodiment or embodiment unless described as such.

Embodiments described herein may also relate to an apparatus (e.g., such as an AC-DC converter, and/or an ESD protection system/circuit) for performing the operations herein. This apparatus may be specially constructed for the required purposes, or it may comprise firmware or hardware logic selectively activated or reconfigured by the apparatus. Such firmware may be stored in a non-transitory computer-readable storage medium, such as, but not limited to, read-only memories (ROMs), random access memories (RAMs), EPROMs, EEPROMs, flash memory, or any type of media suitable for storing electronic instructions. The term "computer-readable storage medium" should be taken to include a single medium or multiple media that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method, comprising:
    detecting, by an electrostatic discharge (ESD) protection circuit, a voltage pulse on an input pin of an integrated circuit (IC) controller, the IC controller coupled between a power supply node and a ground supply node;
    determining, by the ESD protection circuit, an ESD event on the input pin based on the voltage pulse detected on the input pin; and
    controlling, by the ESD protection circuit during the ESD event, one or more clamps to transport the voltage pulse from the input pin of the IC controller to the power supply node.

2. The method of claim 1, wherein the ESD protection circuit controls the one or more clamps by using a plurality of cascoded metal-oxide semiconductor field effect transistors (FETs).

3. The method of claim 1, wherein the one or more clamps comprise a plurality of cascoded metal-oxide semiconductor field effect transistors (FETs).

4. The method of claim 2, wherein:
    the plurality of cascoded metal-oxide semiconductor field effect transistors (FETs) is isolated from a substrate of the IC controller, and
    the voltage pulse corresponds to a negative voltage pulse.

5. The method of claim 1, further comprising:
    generating, responsive to determining the ESD event, a trigger voltage and a plurality of bias voltages; and
    enabling the one or more clamps using the trigger voltage and the plurality of bias voltages.

6. The method of claim 1, further comprising:
    determining that a magnitude of the ESD voltage has increased to an amount greater than a predetermined voltage or has increased to an amount equal to the predetermined voltage; and
    enabling one or more strings of metal-oxide semiconductor field effect transistors (FETs) that are coupled to a trigger resistor to generate a trigger voltage and a plurality of bias voltages.

7. The method of claim 6, wherein the one or more strings comprise a first string of FETs, and a second string of FETs, the first string comprising a current path, and the second string comprising a current path, wherein the current path of the first string is in parallel with the current path of the second string.

8. The method of claim 7, wherein the first string of FETs and the second string of FETs are each configured to compensate each other for variations in at least one of transistor threshold voltages or current gain factors.

9. The method of claim 6, wherein the trigger voltage corresponds to a voltage drop across the trigger resistor and further comprising:
    enabling conduction through a plurality of NFETs by providing the trigger voltage to gate terminals of the plurality of NFETs.

10. The method of claim 9, wherein one or more of the plurality of NFETs are cascoded with a respective NFET of a second plurality of NFETs.

11. The method of claim 10, wherein a first bias voltage of the plurality of bias voltages corresponds to a common voltage on a drain of a first NFET of the one or more strings of NFETs and a source of a second NFET of the one or more strings of NFETs, and further comprising:
    enabling an NFET of the second plurality of NFETs by providing the first bias voltage to a gate terminal of the NFET of the second plurality of NFETs.

12. The method of claim 9, further comprising:
    enabling a plurality of P-channel metal-oxide semiconductor field effect transistor (PFETs) by providing a second bias voltage to gate terminals of the plurality of PFETs.

13. The method of claim 9, wherein an NFET of the plurality of NFETs generates an output voltage by lowering a voltage on a drain terminal or source terminal of a P-channel metal-oxide semiconductor field effect transistor (PFET) of the plurality of PFETs.

14. The method of claim 9, wherein an NFET of the plurality of NFETs generates an output voltage, and further comprising:
    enabling the one or more clamps to transport the voltage pulse from the input pin of the IC controller to the power supply node by at least one of:
        enabling a P-channel metal-oxide semiconductor field effect transistor (PFET) of a cascoded PFET stage by providing the output voltage to a gate terminal of the PFET of the cascoded PFET stage; or
        disabling an NFET of a cascoded NFET stage by providing the output voltage to a gate terminal of the NFET of the cascoded NFET stage.

15. An integrated circuit for electrostatic discharge (ESD) protection, the integrated circuit comprising:
- an integrated circuit (IC) controller, the IC controller coupled between a power supply node and a ground supply node, the IC controller comprising an input pin;
- one or more clamps coupled to the input pin;
- an ESD detector coupled to the input pin, the ESD detector configured to:
  - detect a voltage pulse on the input pin of the IC controller; and
  - determine an ESD event on the input pin based on the voltage pulse detected on the input pin; and
- a controller coupled to the one or more clamps, the controller configured to:
  - control, during the ESD event, the one or more clamps to transport the voltage pulse from the input pin of the IC controller to the power supply node.

16. The integrated circuit of claim 15, wherein the controller controls the one or more clamps by using a plurality of cascoded metal-oxide semiconductor field effect transistors (FETs).

17. The integrated circuit of claim 15, wherein the one or more clamps comprise a plurality of cascoded metal-oxide semiconductor field effect transistors (FETs).

18. The integrated circuit of claim 16, wherein
the plurality of cascoded metal-oxide semiconductor FETs is isolated from a substrate of the IC controller; and
the voltage pulse corresponds to a negative voltage pulse.

19. The integrated circuit of claim 15, wherein
the ESD detector is further configured to generate, responsive to determining the ESD event, a trigger voltage and a plurality of bias voltages; and
the controller is further configured to enable the one or more clamps using the trigger voltage and the plurality of bias voltages.

20. A system, comprising:
- an integrated circuit (IC) controller, the IC controller coupled between a power supply node and a ground supply node, the IC controller comprising an input pin; and
- an ESD protection circuit configured to:
  - detect a voltage pulse on the input pin of the IC controller;
  - determine an ESD event on the input pin based on the voltage pulse detected on the input pin; and
  - control, during the ESD event, one or more clamps to transport the voltage pulse from the input pin of the IC controller to the power supply node.

* * * * *